United States Patent
Zhang et al.

(10) Patent No.: US 10,051,381 B2
(45) Date of Patent: Aug. 14, 2018

(54) MEMS MICROPHONE

(71) Applicants: Jinyu Zhang, Shenzhen (CN); Rui Zhang, Shenzhen (CN); Zhenkui Meng, Shenzhen (CN)

(72) Inventors: Jinyu Zhang, Shenzhen (CN); Rui Zhang, Shenzhen (CN); Zhenkui Meng, Shenzhen (CN)

(73) Assignee: AAC TECHNOLOGIES PTE. LTD., Singapore (SG)

(*) Notice: Subject to any disclaimer, the term of this patent is extended or adjusted under 35 U.S.C. 154(b) by 0 days.

(21) Appl. No.: 15/416,980

(22) Filed: Jan. 26, 2017

(65) Prior Publication Data

US 2018/0115838 A1   Apr. 26, 2018

(30) Foreign Application Priority Data

Oct. 25, 2016   (CN) .................... 2016 2 1164788 U

(51) Int. Cl.
| | |
|---|---|
| H04R 25/00 | (2006.01) |
| H04R 19/04 | (2006.01) |
| H04R 7/04 | (2006.01) |
| H04R 19/00 | (2006.01) |
| B81B 3/00 | (2006.01) |

(52) U.S. Cl.
CPC ........... *H04R 19/04* (2013.01); *B81B 3/0021* (2013.01); *H04R 7/04* (2013.01); *H04R 19/005* (2013.01); *B81B 2201/0257* (2013.01); *B81B 2203/0127* (2013.01); *B81B 2203/0136* (2013.01); *H04R 2201/003* (2013.01); *H04R 2410/03* (2013.01)

(58) Field of Classification Search
USPC ....... 381/174, 176, 178, 335, 342, 347, 348, 381/184, 186, 398, 399
See application file for complete search history.

(56) References Cited

U.S. PATENT DOCUMENTS 8,477,983 B2 *  7/2013  Weigold ................. H04R 1/406
                                                      381/174
9,788,121 B2 * 10/2017  Jiang ....................... H04R 7/04

* cited by examiner

*Primary Examiner* — Yosef K Laekemariam
(74) *Attorney, Agent, or Firm* — Na Xu; IPro, PLLC

(57) ABSTRACT

A MEMS microphone, includes a base with a back cavity and a capacitor system fixed to the base. The capacitor system includes a back plate above the base and a diaphragm opposite to the back plate for forming an insulated gap. The back plate includes a body part and multiple spaced fixation parts extending from the body part, and the diaphragm includes a vibrating part and a connecting part extending from the vibrating part. An orthographic projection of the body part of the back plate along a vibration direction of the diaphragm is completely located on the diaphragm; and at least a part of an orthographic projection of the fixation parts along the vibration direction is located on the diaphragm.

5 Claims, 2 Drawing Sheets

MEMS MICROPHONE

FIELD OF THE PRESENT DISCLOSURE

The present disclosure relates to the technical field of electroacoustic transducers, and more particularly to a micro-electro-mechanical system (MEMS) microphone.

DESCRIPTION OF RELATED ART

Micro-Electro-Mechanical System (MEMS) microphone is a kind of microphone manufactured on the basis of the MEMS technology, due to its characteristics of less encapsulation volume, higher reliability and lower costs, it has been applied in various voice equipment extensively, e.g. electronic products including the mobile phones, tablets, PDA and monitoring equipment etc.

The value of the sensitivity Δd is one of important factors for measuring the performance of a MEMS microphone chip, and the calculation formula of the sensitivity is:

$$S = \frac{\Delta b}{\Delta p} \times \frac{\Delta d}{d} \times \frac{C_0}{C_0 + C_p}$$

where, S is the sensitivity, Δb is the bias voltage, Δp is the measured acoustic pressure, d is the width of the air gap, Δd is the deformation volume of the diaphragm, $C_0$ is the measured capacitor value, and $C_p$ is the parasitic capacitor value.

Therefore, the parasitic capacitor $C_p$ will affect the sensitivity of the MEMS microphone, when the parasitic capacitor increases, the sensitivity decreases. When designing the MEMS microphone, the microphone is desired that the parasitic capacitor could decrease as possible as it can.

In the relevant technologies, the MEMS microphone comprises a base with a back cavity, a diaphragm which is fixed on the base and a back plate which is set opposite to the diaphragm. An insulation gap is formed between the diaphragm and the back plate. However, in the relevant technologies, the diaphragm and the back plate of the MEMS microphone form a completely overlapped concentric circle structure, and the area opposite to the back plate from the invalid vibration area of the diaphragm is bigger, so that a parasitic capacitor is formed around the diaphragm, which reduces the sensitivity of the MEMS microphone.

Thereof, it is necessary to disclose and provide an improved MEMS microphone to overcome the above-mentioned disadvantages.

BRIEF DESCRIPTION OF THE DRAWING

Many aspects of the exemplary embodiments can be better understood with reference to the following drawing. The components in the drawing are not necessarily drawn to scale, the emphasis instead being placed upon clearly illustrating the principles of the present disclosure.

DETAILED DESCRIPTION OF THE EXEMPLARY EMBODIMENTS

The present disclosure will hereinafter be described in detail with reference to exemplary embodiments. To make the technical problems to be solved, technical solutions and beneficial effects of the present disclosure more apparent, the present disclosure is described in further detail together with the figure and the embodiments. It should be understood the specific embodiments described hereby are only to explain this disclosure, not intended to limit this disclosure.

Figure 1:
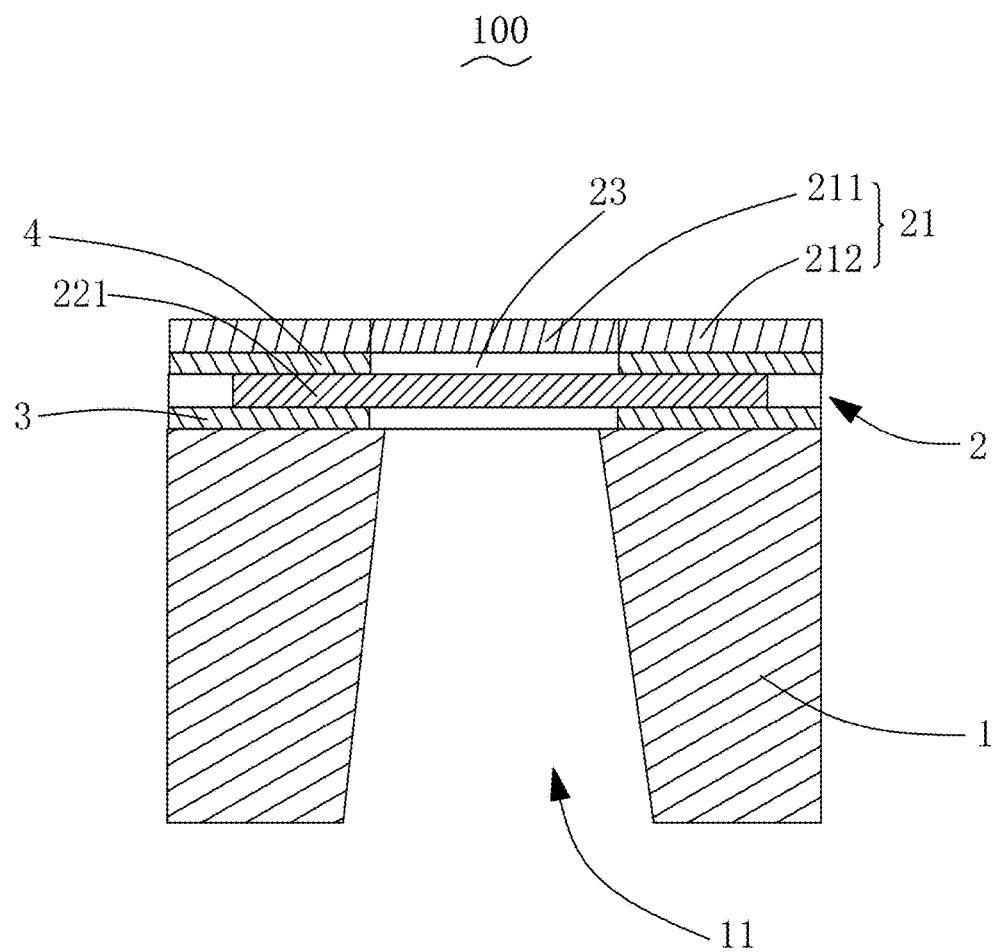
FIG. 1 is an illustrative structural view of a MEMS microphone.
Figure 2:
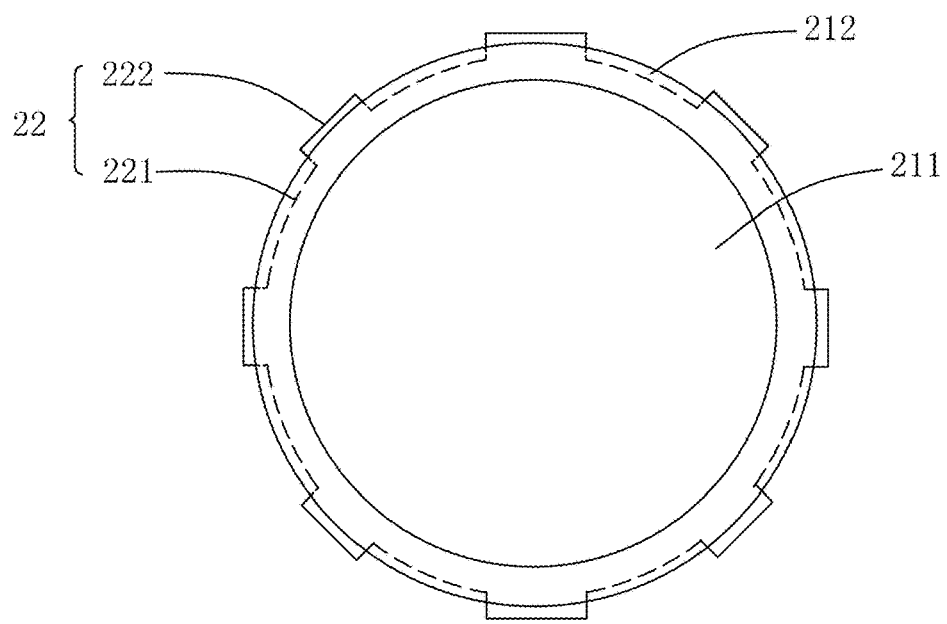
FIG. 2 is an assembled view of a diaphragm and a back plate of the MEMS microphone in accordance with a first embodiment.

Referring to FIGS. 1-2, a MEMS microphone 100 comprises a base 1, a capacitor system 2 supported by the base 1, a first insulation layer 3 and a second insulation layer 4. The first insulation layer 3 is disposed between the base 1 and the capacitor system 2.

The base 1 has a back cavity 11, which is also known as an acoustic cavity. In this embodiment, the base 1 is a silicon base, and the back cavity 11 is formed by etching. Of course, the material of the base 1 and the formation of the back cavity 11 are not only limited to this, it is feasible that an acoustic cavity structure of the MEMS microphone 100 is formed by other means.

The capacitor system 2 comprises a back plate 22 located above the base 1 and a diaphragm 21 overlapped above the back plate 22. The diaphragm 21 and the back plate 22 are opposite to each other, and an insulation gap 23 is accordingly formed. When the diaphragm 21 and the back plate 22 are connected to two external electrodes respectively, a capacitor is accordingly formed. When external acoustic wave is driving the diaphragm 21 to vibrate, the distance of the insulation gap 23 between the diaphragm 21 and the back plate 22 is changed, so that a capacitor is generated by the capacitor system 2, and the change of the capacitor further produces current, i.e. changes the electric signal, and completes the electroacoustic conversion.

Specifically, the back plate 22 is used for forming a back pole area, and comprises a body part 221 and multiple spaced fixation parts 222 extending from the periphery of the body part 221, and the fixation parts 222 are fixed above the first insulation layer 3.

The diaphragm 21 comprises a vibrating part 211 and a connecting part 212 extending from the periphery of the vibrating part 211, and the second insulation layer 4 is fixed between the diaphragm 21 and the back plate 22. The connecting part 212 is fixed on the second insulation layer 4 for forming an invalid vibration area, and a valid vibration area is formed on the vibration part. A projection of the body part 221 of the back plate 22 along a vibration direction of the diaphragm 21 is completely located on the diaphragm 21, and at least a part of a projection of the fixation parts 222 along the vibration direction is located in the scope of the diaphragm 21.

The first insulation layer 3 is fixed between the base 1 and the capacitor system 2, and the second insulation layer 4 is fixed between the diaphragm 21 and the back plate 22. Both the first insulation layer 3 and the second insulation layer 4 are provided with vent-holes penetrating therethrough.

In this embodiment, the fixation parts 222 are spaced apart with a certain distance for forming comb fingers. Of course, it also works if there are multiple fixation parts 222 which form a ring comb-finger structure together.

Figure 3:
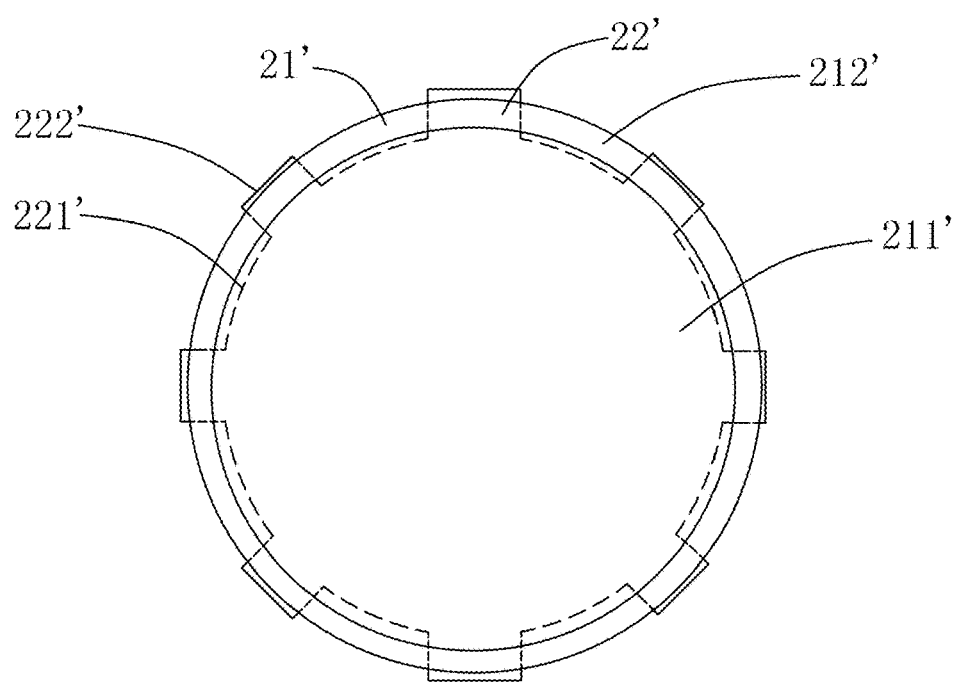
FIG. 3 is an assembled view of a diaphragm and a back plate of the MEMS microphone in accordance with a second embodiment.

Referring to FIG. 3, a projection of the body part 221' of the back plate 22' along the vibration direction of the diaphragm 21' is completely located in the scope of the vibrating part 211' of the diaphragm 21', and at least a part of a projection of the fixation parts 222' of the back plate 22' along the vibration direction of the diaphragm 21' is located in the scope of the diaphragm 21'.

Above structure of the back plate 22' sets the fixation parts 222' into multiple individual structures with intervals from the original ring structure, and the area of the fixation parts 222' is decreased relatively, i.e. the area of the relative part set between the back plate 22' and the diaphragm 21' is decreased.

Because that the value of a parasitic capacitor is related to an area of an invalid vibration area of the diaphragm 21 above the back plate 22, when working, as long as the invalid vibration area of the diaphragm 21 has a part corresponding to the back plate from top to bottom, the parasitic capacitor will be formed in the area where the invalid area of the diaphragm 21 as a whole is located (i.e. the connecting part 212), in the case where the invalid vibration area of the diaphragm 21, i.e. the size of the connecting part 212, is fixed, the more the area of the back pole area which is formed by the back plate 22 is, the more the parasitic capacitor will be.

However, an area of the back plate 22 of the MEMS microphone 100 decreases an area of the fixation parts 222 on the original basis, i.e. a relative area of the back pole area of the back plate 22 and the diaphragm 21 is decreased, so that a parasitic capacitor of the MEMS microphone 100 is decreased, in order to improve its sensitivity and acoustic performance. Meanwhile, another part of the orthographic projection of the fixation parts 222 towards the direction of the diaphragm 21 is located beyond the scope of the diaphragm 21, when the fixation parts 222 is fixed on the base 1, it means that there will be more size of the fixation parts 222 to be fixed, so that its fixed intensity is reinforced, and the stability of the MEMS microphone 100 is improved.

Comparing with the existing technologies, a MEMS microphone provided herein has multiple fixation parts of the back plate which are set with intervals, and makes the orthographic projection of the fixation parts towards the direction of the diaphragm is completely located in the scope of the diaphragm, i.e. the area of the part corresponding to the connecting part of the back plate is decreased, so that the parasitic capacitor of the capacitor system is decreased, in order to improve the sensitivity and acoustic performance of the MEMS microphone.

It is to be understood, however, that even though numerous characteristics and advantages of the present exemplary embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms where the appended claims are expressed.

What is claimed is:

1. A MEMS microphone, including:
   a base with a back cavity;
   a capacitor system fixed to the base, the capacitor system including a back plate above the base and a diaphragm opposite to the back plate for forming an insulated gap; wherein
   the back plate includes a body part and multiple spaced fixation parts extending from the body part, and the diaphragm includes a vibrating part and a connecting part extending from the vibrating part;
   an orthographic projection of the body part of the back plate along a vibration direction of the diaphragm is completely located on the diaphragm; and
   at least a part of an orthographic projection of the fixation parts along the vibration direction is located on the diaphragm.

2. The MEMS microphone as described in claim 1, wherein the orthographic projection of the body part of the back plate along the vibration direction is completely located on the vibrating part.

3. The MEMS microphone as described in claim 1, wherein the fixation parts are spaced apart with a certain distance for forming comb fingers.

4. The MEMS microphone as described in claim 1, wherein the fixation parts form a ring comb finger structure together.

5. The MEMS microphone as described in claim 1 further comprising a first insulation layer fixed between the base and the back plate, and a second insulation layer is fixed between the diaphragm and the back plate, both the first insulation layer and the second insulation layer are provided with a plurality of ventholes penetrating therethrough.

\* \* \* \* \*